(12) United States Patent
Cok et al.

(10) Patent No.: US 7,741,770 B2
(45) Date of Patent: Jun. 22, 2010

(54) LED DEVICE HAVING IMPROVED LIGHT OUTPUT

(75) Inventors: Ronald S. Cok, Rochester, NY (US); Michael E. Miller, Honeoye Falls, NY (US)

(73) Assignee: Global OLED Technology LLC, Wilmington, DE (US)

( * ) Notice: Subject to any disclaimer, the term of this patent is extended or adjusted under 35 U.S.C. 154(b) by 273 days.

(21) Appl. No.: 11/867,885

(22) Filed: Oct. 5, 2007

(65) Prior Publication Data

US 2009/0091238 A1 Apr. 9, 2009

(51) Int. Cl.
*H01J 1/62* (2006.01)

(52) U.S. Cl. ..................... 313/498; 313/503

(58) Field of Classification Search ......... 313/495–498, 313/582–587
See application file for complete search history.

(56) References Cited

U.S. PATENT DOCUMENTS

| | | | |
|---|---|---|---|
| 5,554,911 A | 9/1996 | Nakayama et al. |
| 5,949,187 A | 9/1999 | Xu et al. |
| 6,384,529 B2 | 5/2002 | Tang et al. |
| 6,570,584 B1 | 5/2003 | Cok et al. |
| 6,861,800 B2 | 3/2005 | Tyan et al. |
| 6,919,681 B2 | 7/2005 | Cok et al. |
| 6,987,355 B2 | 1/2006 | Cok |
| 7,030,553 B2 | 4/2006 | Winters et al. |
| 7,189,238 B2 | 3/2007 | Lombardo et al. |
| 2005/0040756 A1 | 2/2005 | Winters et al. |
| 2005/0225232 A1 | 10/2005 | Boroson et al. |
| 2005/0225237 A1 | 10/2005 | Winters |
| 2006/0066228 A1 | 3/2006 | Antoniadis et al. |

*Primary Examiner*—Joseph L Williams
*Assistant Examiner*—Brenitra M Lee
(74) *Attorney, Agent, or Firm*—Morgan Lewis & Bockius LLP

(57) ABSTRACT

A light-emitting microcavity diode device includes a reflective electrode and a semi-transparent electrode, formed over a substrate, with an unpatterned light-emitting layer formed between the reflective electrode and the semi-transparent electrode. The reflective electrode, semi-transparent electrode, and unpatterned light-emitting layer form an optical cavity. Either the reflective or semi-transparent electrode is patterned to form independently-controllable, light-emitting sub-pixels. At least one, and fewer than all, of the sub-pixels emit light through a color filter. A first sub-pixel emits light having a first primary color and a second sub-pixel emits a complementary colored light. The light emitted from the first and second sub-pixels changes at one or more different angles. The color of the combined light of the first and second sub-pixels changes less at the one or more different angles than the light from at least one of the first or second sub-pixels. A third sub-pixel emits light through a color filter of a second primary color, different from the first primary color.

16 Claims, 12 Drawing Sheets

# LED DEVICE HAVING IMPROVED LIGHT OUTPUT

FIELD OF THE INVENTION

The present invention relates to light-emitting diode (LED) devices, and more particularly, to LED device structures for improving light output efficiency.

BACKGROUND OF THE INVENTION

Emissive flat-panel display devices are widely used in conjunction with computing devices and in particular with portable devices. These displays are often used in public areas with significant ambient illumination and are viewed from a wide variety of angles.

Light emitting diodes (LED) incorporating thin films of light-emitting materials have many advantages in a flat-panel display device and are useful in optical systems. U.S. Pat. No. 6,384,529 issued May 7, 2002 to Tang et al. shows an OLED color display that includes an array of organic LED light-emitting elements (pixels). Light is emitted from a pixel when a current is passed through an organic material, the frequency of the light is dependent on the nature of the organic material used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials may also be employed to control charge injection, transport, or blocking to the light-emitting-thin-film materials, and are known in the art.

Optical cavity structures are known to increase the light emitted from an OLED device structure. Such optical cavity structures are also known as microcavities or optical microcavities when formed in thin films. When formed in LED devices, different color light-emitting organic materials are pattern-wise deposited over a substrate between a reflective electrode and a semi-transparent electrode. Light emitters having different colors are thus formed within an optical cavity tuned to a desired peak wavelength of light, typically corresponding to the color of light emitted by the patterned organic materials. U.S. Pat. No. 6,680,570 describes an organic light-emitting device with improved color control employing spacer layers to form an optical cavity. FIG. 9 illustrates such a prior-art, active-matrix, bottom-emitting optical cavity device employing a substrate 10 with active-matrix thin-film components 30, planarization structures 32 and 34, and a semitransparent electrode 16. Patterned organic materials 14R, 14G, and 14B, providing red, green, and blue light emission, are deposited in a light-emitting layer 14. Optical spacers 26R, 26G, and 26B are employed to form optical cavities 60, 62, and 64 tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology (for example, vacuum deposition through metal shadow-masks) that is difficult to scale to large substrates. Moreover, optical cavity devices typically suffer from an unacceptable angular color dependence. It is also known to employ a color filter with an optical cavity structure, for example, as taught in U.S. Pat. No. 7,189,238. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled, "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer. The material for the semi-transparent metallic electrode layer includes Ag, Au, or alloys thereof. The thickness of the semi-transparent metallic electrode layer, the combined thickness of the organic layers, and the transparent conductive phase-layer; and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second OLED and defines an optical length of the second microcavity. The optical length of the second microcavity is such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change at different viewing angles, owing to the change in the effective optical path length for light traveling at angles to the normal.

US 2006/0066228 A1 entitled, "Reducing or eliminating color change for microcavity OLED devices", by Antoniadis discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again, such designs may have increased manufacturing costs due to patterned deposition processes. Also, significant light may be absorbed by the color filters thereby, reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled, "Stacked OLED Display having Improved Efficiency" by Cok. However, the use of color filters substantially reduces the efficiency of the device. It is also known to employ a white sub-pixel that does not include a color filter, for example, as taught in U.S. Pat. No. 6,919,681 entitled, "Color OLED Display with Improved Power Efficiency" by Cok et al. However, this disclosure does not address angular color issues or the large amount of trapped light.

U.S. Pat. No. 7,030,553 entitled, "OLED device having microcavity gamut sub-pixels and a within gamut sub-pixel" by Winters et al, discloses an example of a prior-art microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode that can be difficult to manufacture in a top-emitting format. Moreover, angular color change is not addressed. U.S. Pat. No. 6,570,584 entitled, "Broad Color Gamut Display" by Cok et al describes a digital color image display device, including a plurality of pixels, each pixel having a plurality of sub-pixels with at least one of the sub-pixels producing a color other than red, green, or blue. However, there is no teaching of improving device efficiency. US 2006/0192220 describes a bottom emitter device having a patterned reflection film to form both light-emitting regions having a microcavity and light-emitting regions without a microcavity. This particular structure requires a patterned reflection film, thereby increasing costs. The structure is also not useful for unpatterned light-emitting layers.

There still remains a need, therefore, for an improved light-emitting structure that overcomes shortcomings in the prior art and that increases the light output and angular color performance of an LED device, such as a display.

SUMMARY OF THE INVENTION

The need is met in one embodiment of the present invention with a light-emitting microcavity diode device that includes a reflective electrode and a semi-transparent electrode, formed over a substrate, with an unpatterned light-emitting layer formed between the reflective electrode and the semi-transparent electrode. The reflective electrode, semi-transparent electrode, and unpatterned light-emitting layer form an optical cavity. Either the reflective or semi-transparent electrode is patterned to form independently-controllable, light-emitting sub-pixels. At least one, and fewer than all, of the sub-pixels emit light through a color filter. A first sub-pixel emits light having a first primary color and a second sub-pixel emits a complementary colored light. The light emitted from the first and second sub-pixels changes at one or more different angles. The color of the combined light of the first and second sub-pixels changes less at the one or more different angles than the light from at least one of the first or second sub-pixels. A third sub-pixel emits light through a color filter of a second primary color, different from the first primary color.

Another aspect of the present invention provides a method of forming a light-emitting microcavity diode device that includes the following, steps:

a) selecting primary and secondary colored, light-emitting microcavity structures that when applied together provide a display white point having an acceptable change in chromaticity coordinates as a function of viewing angle; and b) forming an array comprising first primary colored microcavity structure and second complementary colored, light-emitting microcavity structure, together with at least one additional primary colored, light-emitting microcavity structure on a substrate, wherein at least the one additional primary colored, light-emitting microcavity structure includes a color filter and at least one of the first primary colored microcavity structures and the complementary colored, light-emitting microcavity structures does not include a color filter.

ADVANTAGES

The present invention has the advantage that it increases the light output and reduces any angular color change of an LED device.

It will be understood that the figures are not to scale since the individual layers are too thin and the thickness differences of various layers too great to permit depiction to scale.

DETAILED DESCRIPTION OF THE INVENTION

Figure 1:
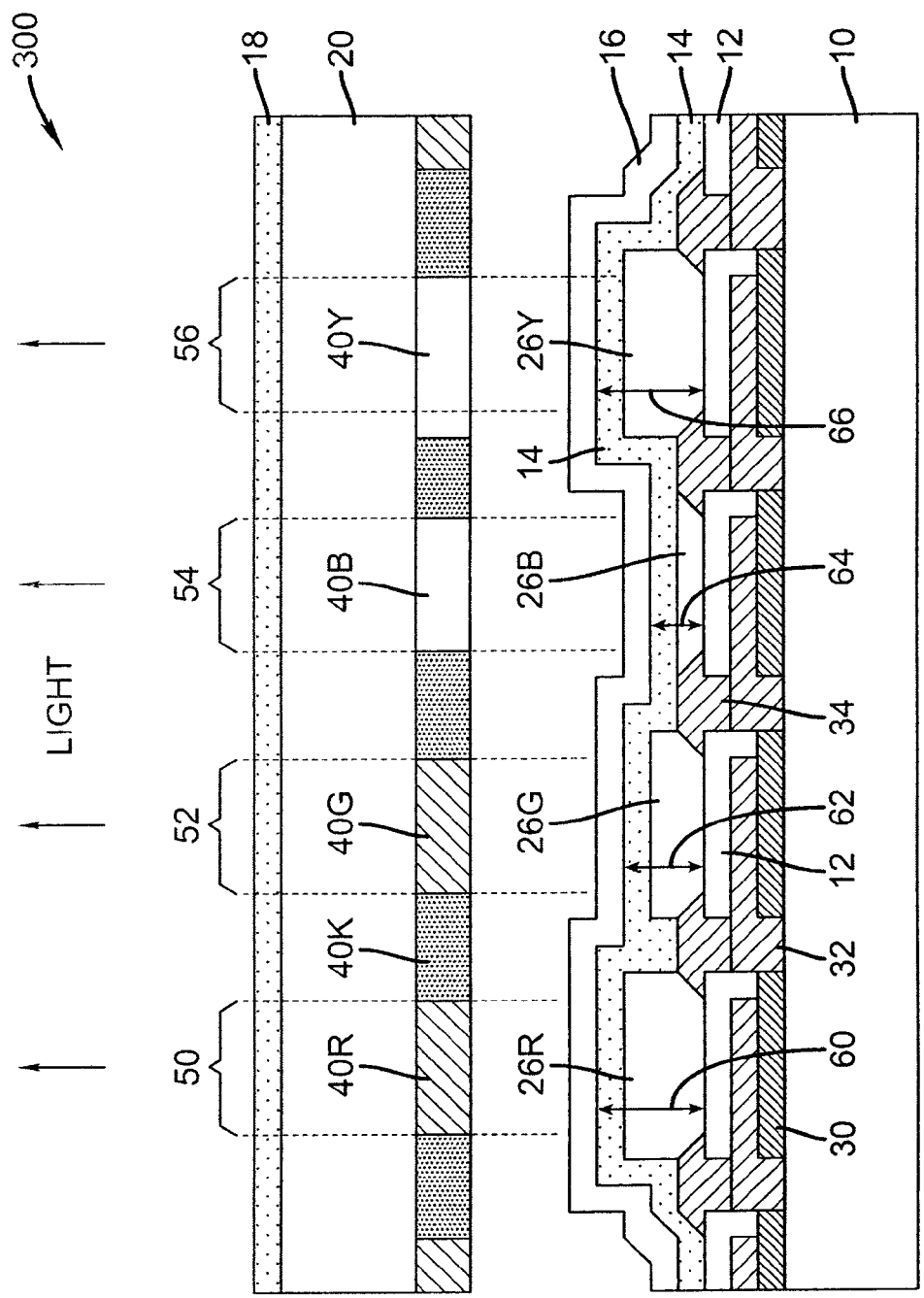
FIG. 1 illustrates a partial cross section of a top-emitter LED device according to an embodiment of the present invention.

Referring to FIG. 1, an exemplary embodiment of a light-emitting diode device according to the present invention comprises a substrate 10, a reflective electrode 12, and a semi-transparent electrode 16 formed over the substrate 10. Either the reflective electrodes 12 or semi-transparent electrodes 16 are patterned to form a plurality of independently-controllable light-emitting sub-pixel elements 50, 52, 54, and 56. As shown in FIG. 1, for example, reflective electrode 12 is patterned. The independently-controllable light-emitting elements can be controlled, for example by thin-film electronic components 30 formed on the substrate 10. The other electrode (e.g. 16) can be unpatterned and electrically common to all of the light-emitting elements 50, 52, 54, and 56. An unpatterned light-emitting layer 14 is formed between the reflective electrode 12 and the semi-transparent electrode 16 and includes multiple layers. The reflective electrode 12, semi-transparent electrode 16, and unpatterned white-light-emitting layer 14 form optical cavities 60, 62, 64, and 66. At least one, and fewer than all, of the sub-pixels 50, 52, 54, 56 emits light through a color filter. At least one color filter 40R, 40G, and 40B is formed over a side of the semi-transparent electrode 16, opposite the unpatterned white-light-emitting layer 14, in correspondence with the sub-pixels 50, 52, 54, to form colored sub-pixels. Typically, the color filters have at least two different colors.

A first sub-pixel (e.g. 54) emits light having a first primary color (e.g. blue) and a second sub-pixel (e.g. 56) emits a complementary color light with respect to the primary color (e.g. yellow). The light from the first and second sub-pixels changes at different angles. The color of the combined light of the first and second sub-pixels changes less at different angles than the light from at least one of the first or second sub-pixels. A third sub-pixel (e.g. 50 or 52) emits light of a second primary color (e.g. red) different from the first primary color and the third sub-pixel emits light through a color filter (e.g. 40R).

Those knowledgeable in the art will readily understand that any of red, green, or blue could be emitted by the first sub-pixel while the second sub-pixel would then emit the complementary colors of cyan, magenta, or yellow, respectively. The third sub-pixel could then emit either green or blue in the first case, red or blue in the second case, or green or red in the third case. A fourth sub-pixel can be employed to emit a remaining primary color and can employ a color filter to control saturation and angular color emission. It is preferable, but not required, in this invention, that the complementary color emission have a higher luminous efficiency than at least one (and possibly more) of the primary sub-pixels. Hence, the present invention can be employed to increase the efficiency of a full-color LED device such as a display. Also, in various embodiments of the present invention, the first and second sub-pixels may, or may not, include color filters, while the third and fourth (if present) can. In one embodiment, the third and fourth sub-pixels include a color filter while the first and second sub-pixels do not. In an alternative embodiment, the second sub-pixel does include a color filter. In one embodiment of particular interest, the third and fourth sub-pixels are red and green and include corresponding color filters, while the first sub-pixel is blue and does not include a color filter. The second sub-pixel is then yellow and does not include a color filter, although a yellow color filter can be useful, as described below. This configuration is particularly interesting, because the yellow emitter can be very efficient, particularly in organic light-emissive layer.

The present invention employs microcavity devices to enhance the output of high-optical index, thin films of light-emitting materials. Such thin-films exhibit a strong color dependence on angle. Hence, color filters can be provided to reduce the color angular dependence, at the cost of luminance angular dependence. Unfortunately, it can also be the case that blue emitters (particularly for organic materials) are very inefficient. One approach to overcoming the inefficiency of blue emitters is to employ a fourth, more-efficient white sub-pixel in a full-color pixel to emit unsaturated light. Such light is prevalent in most images. An alternative approach is to employ a yellow sub-pixel that is more efficient than the blue sub-pixel as the fourth sub-pixel. However, as demonstrated by applicants, such white or yellow sub-pixels vary significantly in their color as viewing angle changes. While the addition of color filters (at least for the yellow case) can reduce the angular changes, such a color filter reduces the efficiency of the fourth emitter and thereby the reason for including the fourth sub-pixel. Hence, in prior-art designs employing microcavities, either inefficient emitters are employed, an unacceptably strong angular variation is prevalent, or inefficient color filters are used in combination with a fourth emitter. Moreover, prior-art microcavity designs require patterned emitters or a patterned semi-transparent electrode, both of which greatly increase manufacturing costs.

The present invention overcomes these objections to the prior art. By employing an unpatterned light emitting layer (e.g. a white-light-emitting layer or layers) with patterned optical spacing elements to form a variety of microcavity structures that emit in combination a primary color and additional, complementary color emitter, more efficient. Unpatterned materials may be used, angular color change mitigated, and efficient light output achieved. Each of the microcavities emits colored light due to constructive interference within the various optical cavities. However, applicants have demonstrated that, when an unpatterned white-light emitting layer is employed, red and green colors are insufficiently saturated to provide a good color gamut in most cases, while the blue emitter can be acceptable. All of the sub-pixels (without a color filter) exhibit significant color dependence on angle. This is mitigated (for white-light emission) by combining the emission of complementary-color-light-emitting sub-pixels. In particular, a blue first sub-pixel without a color filter, a complementary yellow sub-pixel without a color filter, and red and green sub-pixels with color filters can be employed. As discussed in more detail below, the red and green microcavity emitters efficiently emit light and the angular color variation is controlled by the corresponding color filters. The blue sub-pixel is more efficient, because it does not include a color filter. The yellow sub-pixel typically has greater efficiency compared to the blue and red emitters (when derived from an unpatterned white-light-emitting layer) and is employed in combination with the blue sub-pixel to emit apparently white light when forming unsaturated colors. Moreover, the angular color change that occurs for each of the blue and yellow emitters (in the absence of color filters that reduce efficiency), when combined, reduces the angular color change of the apparently white light. Hence, an efficient, full-color system with reduced angular color change is provided. Although, the color combinations described above may be employed in one exemplary embodiment of the present invention, alternative color combinations may be employed and are included in the present invention.

As employed in the present invention, a pixel is a multicolor picture element comprising three or more sub-pixels, each sub-pixel includes an independently-controlled light emitter emitting light of a different color. Typically, pixels include red, green, and blue sub-pixels (an RGB configuration). In addition, as employed in this disclosure, a complementary-color, independently-controllable sub-pixel is also included in each pixel (e.g. a yellow emitter in an RGBY configuration. When a yellow sub-pixel is employed in an RGBY configuration, if the yellow sub-pixel has a greater luminous efficacy than at least one of the red, green, or blue sub-pixels (as will generally be true due to the lack of a color filter over the yellow sub-pixel and a more efficient emitter) increased brightness or reduced power utilization is obtained for images containing regions having low-to-moderate color saturation (i.e. having a significant gray component). The light-emitting elements 50, 52, 54, 56 correspond to sub-pixels.

The present invention thus employs an RGBY (red, green, blue, and yellow) sub-pixel architecture to form individual pixels in an information presentation device, such as a display. A common, unpatterned white-light emitter 14 is employed. Colored light is formed by a combination of separately tuned microcavities for each color together with color filters 40R, 40G (for the color sub-pixels). A black matrix 40K can be employed to absorb ambient light between the light-emitting elements 50, 52, 54, 56. Planarizing and insulating layers 32 and 34 can be provided to electrically separate the independently-controllable light-emitting elements. Color filters are not necessary for both the first primary sub-pixel and the complementary second sub-pixels; but one or the other may employ a color filter (e.g. either 40B or 40Y, but not both).

According to some embodiments of the present invention, the complementary-color sub-pixel emitter can be more efficient than at least one of the colored sub-pixels. Furthermore, one or both of a complementary pair of light emitters can be more efficient than at least one of the colored primary sub-pixels. The emission may be more efficient in comparison to the colored sub-pixels, even if the colored sub-pixels did not include a color filter. It is desirable, however, that a white color formed by the complementary pair of light-emitting elements (e.g. blue and yellow) be higher in luminance efficiency than the same white color when formed by the three primary display colors (e.g. red, green, and blue). The efficiency of the common, unpatterned white emitter is defined in terms of either radiant or luminous efficiency.

Figure 2:
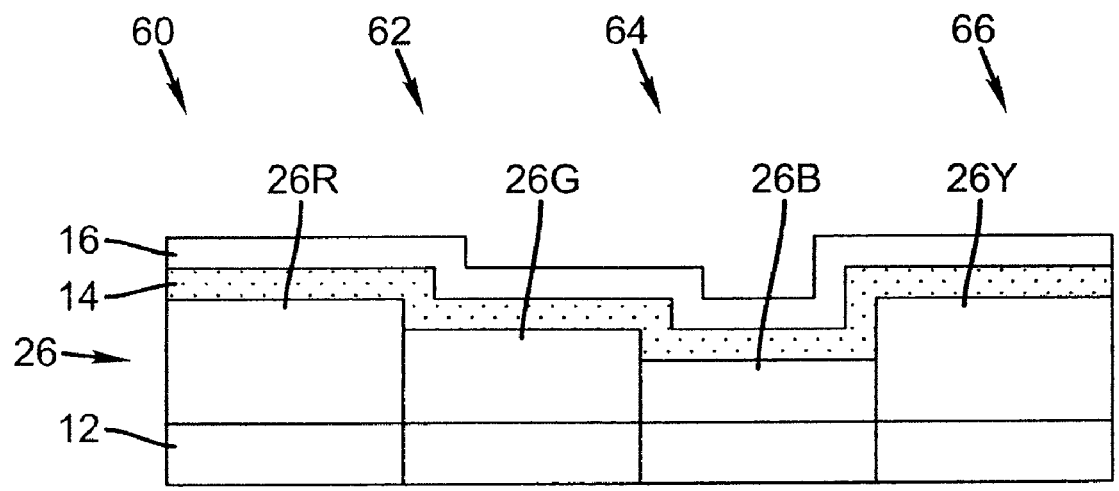
FIG. 2 illustrates a partial cross section of a top-emitter LED device shown in FIG. 1 according to an embodiment of the present invention.
Figure 3:
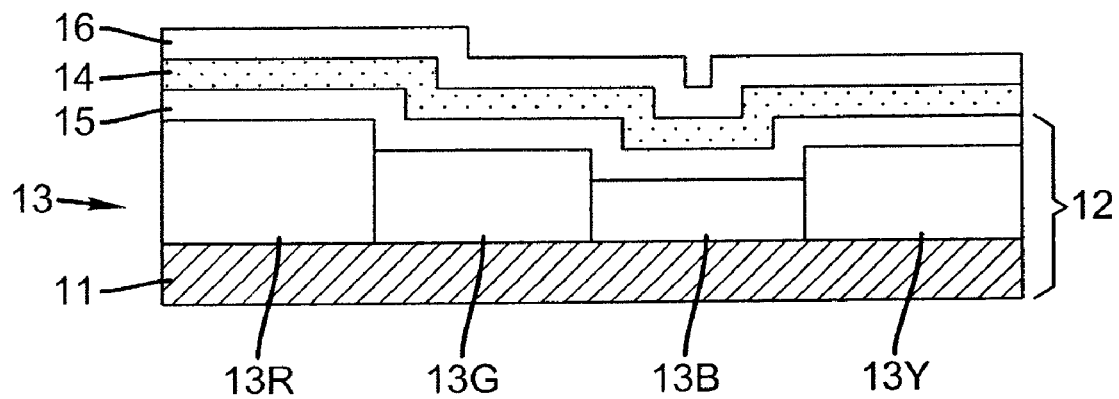
FIG. 3 illustrates optical spacers useful with various embodiments of the present invention.

Referring to FIG. 2, in a more detailed drawing of a portion of FIG. 1, a reflective electrode 12 is formed over a substrate (not shown) together with spacers 26 for tuning optical cavities. Each of the optical cavities 60, 62, 64, 66 is tuned with corresponding spacers 26R, 26G, 26B, 26Y to form optical microcavities, e.g. tuned to red, green, blue, and yellow respectively. As shown in FIG. 1, the present invention may employ spacer layers 26R, 26G, 26B, and 26Y having different thicknesses between the reflective electrode 12 and the light-emissive layer 14. The different thicknesses are chosen to tune the optical response of the different optical cavities 60, 62, 64, 66. In an alternative embodiment of the present invention, shown in FIG. 3, the optical cavities may be tuned by employing transparent spacer layers 13R, 13G, 13B, 13Y between a reflective layer 11 and a transparent conductive layer 15, the reflective layer 11 and transparent conductive layer 15 also comprising the reflective electrode 12. In other embodiments, (not shown) spacer layers can be located in other positions, for example, between the light-emissive layer 14 and the semi-transparent electrode 16. In all of these exemplary embodiments, a reflective layer and a conductive layer together comprise the reflective electrode, whether or not the reflective layer and the conductive layer are the same layer, adjacent layers, or are separated by spacer layers.

In this disclosure, complementary wavelengths of light are those wavelengths of light that, when viewed together, form a substantially white-appearing light such as light on or near the Planckian locus. For example, blue and yellow form a complementary pair, as do cyan and red and magenta and green. According to various exemplary embodiments of the present invention, the sub-pixels may form pixels in a display wherein the sub-pixels are not individually distinguished by eye at a design viewing distance. Hence, the light emitted from the primary and complementary sub-pixels (e.g. 54, 56 in FIG. 1) will be viewed as white by a typical human eye, even though the light emitted is actually a combination of complementary colors.

In actual operation, current, for example, as supplied through thin-film transistors 30, passes through the light-emitting layer 14 via the electrodes 12 and 16, causing light to be emitted. Some of the emitted light passes directly out of the device or through the color filters and out of the device. Other light is reflected from the reflective electrode 12 and passes out of the device. Other light, emitted at a higher angle to the normal, is trapped via total internal reflection. The optical cavity structures serve to reduce the angle of emission of the emitted light, thereby reducing the amount of trapped light and also focusing more of the desired light in the forward direction. The present invention may be employed with both active-matrix and passive-matrix control circuits.

In particular, the present invention provides a means to form a substantially white light that is viewed as white at a variety of angles from the normal. The light output from the complementary optical microcavities, e.g. 64, 66 increases in frequency (and decreases in wavelength) as the angle at which the light is emitted increases from the normal (90 degrees) with respect to the substrate. Within the prior art, it is understood that microcavities can be formed which vary in strength according to the reflectivity of the semi-transparent electrode. Devices having a strong microcavity will emit saturated (non-white) light. However, devices having a weaker microcavity may produce light that is relatively white when formed using an unpatterned white emitter. According to the prior art, when placed within a weak microcavity, a white emitter layer will produce a white light. However, such a single-element white emitter would tend to emit light that is shifted towards short wavelengths when viewed at angles greater than 0 degrees as measured to the normal of the reflective electrode 12. Since white emitters are inherently broadband, a general shift in a broad range of frequencies is seen at higher angles to the normal. In addition, the human visual system is most sensitive to green and, therefore, such a device will typically take on a green or cyan appearance when viewed at angles greater than 0 degrees from a normal to the reflective electrode.

Nevertheless, according to one embodiment of the present invention, stronger microcavities may be employed to form a white-light-emitting element from two or more different optical microcavities, which individually may emit light that exhibits significant color saturation and has a narrower bandwidth than the white-light emitters alone. The different optical microcavities of the complementary sub-pixels 54, 56 can mutually compensate for the shift in the output frequency that occurs in each of the individual microcavities when they are viewed at an angle greater than 0 degrees. More precisely, the wavelength or efficiency of the light emitted from each of the complementary sub-pixels 54, 56 will change at different viewing angles, but in a complementary fashion such that the white-point of the combined light emission from the complementary sub-pixels 54, 56 will undergo a relatively small change as compared to the color change of the individual sub-pixels 54, 56, or the other primary sub-pixels 50, 52.

Figure 4:
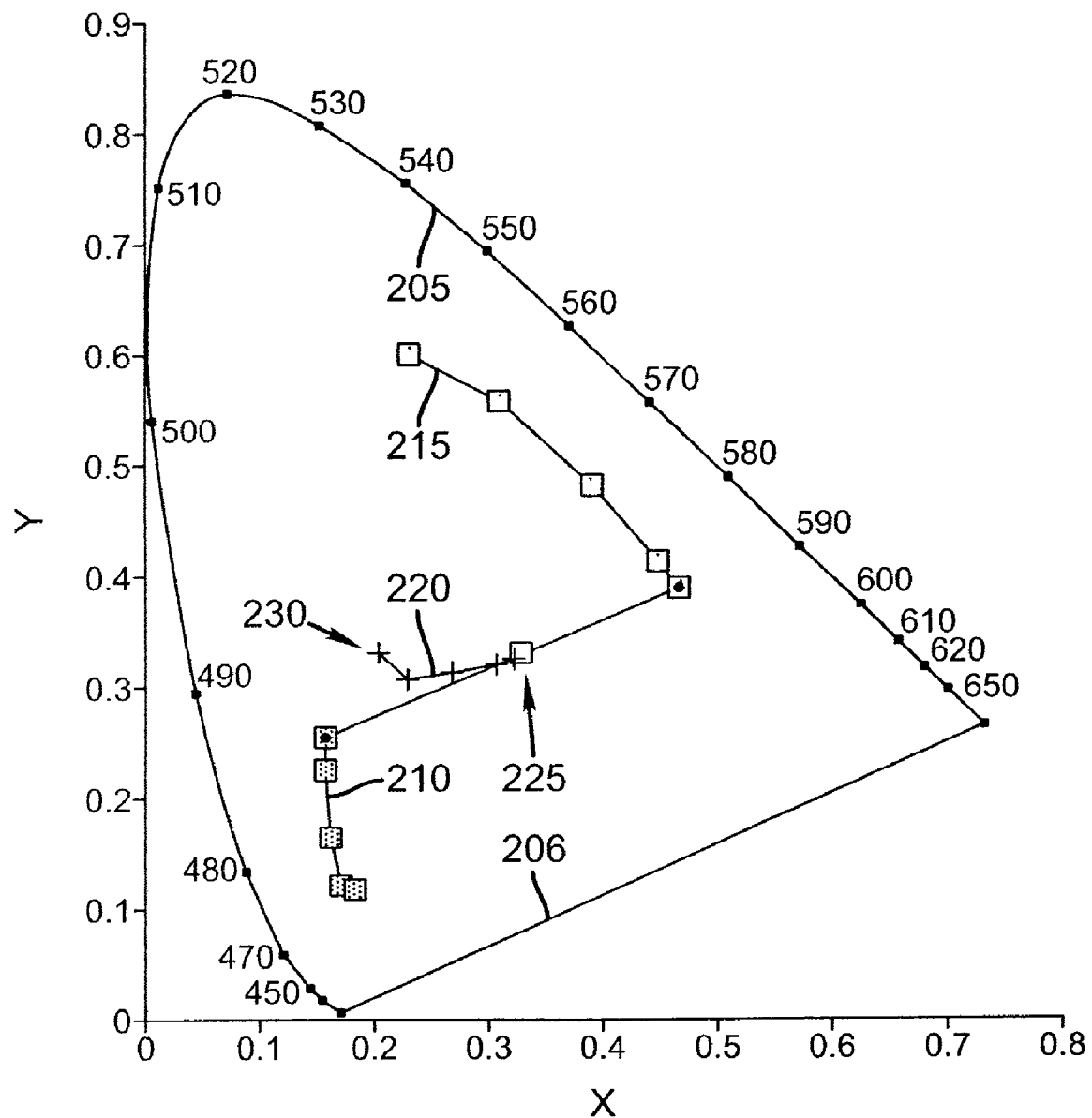
FIG. 4 is a graph illustrating the light emission wavelengths in CIEx and CIE y space of various embodiments of the present invention.

Referring to FIG. 4, a CIE 1931 x,y chromaticity diagram is shown with a spectrum locus 205 illustrating the position of monochromatic light sources, and a combining red and blue light boundary 206. The area enclosed by the spectrum locus 205 and the red and blue boundary 206 includes all visible colors. The light emission 210 of a cyan/blue-emitting optical microcavity (e.g. from optical microcavity 64) is shown at a plurality of increasing angles with respect to the substrate's normal, beginning at the normal with x,y coordinates of 0.160, 0.253 and ending at 60 degrees with x,y coordinates of 0.186, 0.116. In particular, note that as the viewing angle of the optical microcavity increases, the perceived color of the light becomes bluer, with a higher frequency and shorter wavelength. Likewise, the CIE coordinates 215 of a yellow/green-emitting optical microcavity (e.g. from optical microcavity 66) is shown at a plurality of angles. Again, as the viewing angle of the optical microcavity increases, the perceived color of the light becomes greener, with a higher frequency and shorter wavelength, beginning at x,y coordinates of 0.469, 0.389 and ending at x,y coordinates of 0.233, 0.598. Although the light emitted from the primary and complementary sub-pixels is colored, since the colors are complementary the combined light appears to be white, having CIE 1931 chromaticity coordinates of 0.267, 0.300 when viewed at 0 degrees viewing angle and 0.1987, 0.246 when viewed at an angle of 60 degrees, shown as CIE coordinates 220. As the angle of view changes, both the blue and yellow emitters change color significantly. However, the combined color stays relatively constant and substantially white. Point 225 illustrates the white point at a normal angle relative to the substrate and point 230 illustrates the white point at a 60-degree angle relative to the substrate normal. These curves are taken from a real, white-light OLED device made by applicants with the change in color at different angles modeled.

Figure 5:
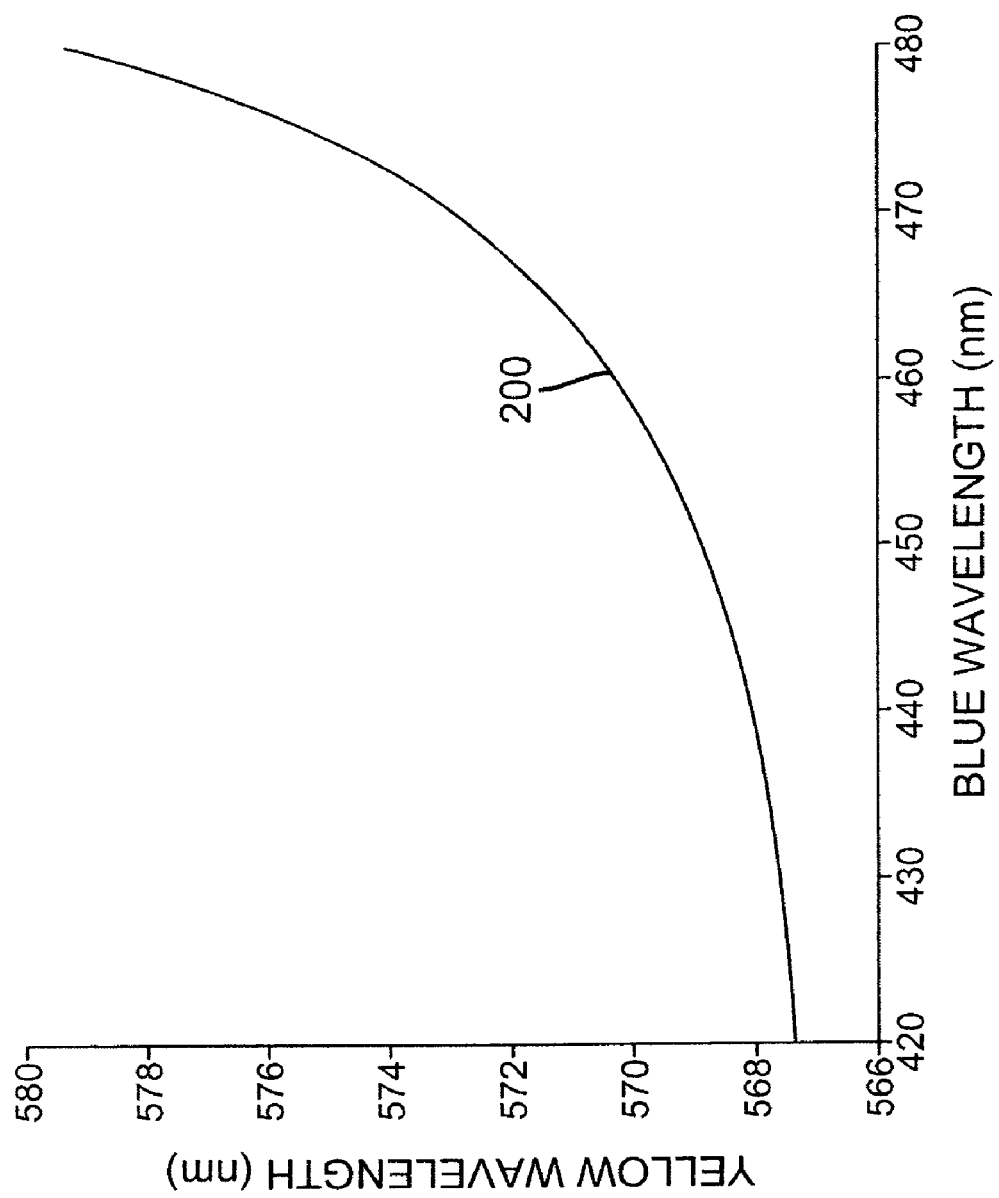
FIG. 5 is a graph illustrating the constant D65 light output for various yellow and blue frequency combinations useful in understanding various embodiments of the present invention.

As can be seen from this graph, the chromaticity coordinates of the white change little in the y dimension, while a somewhat larger change is seen in the x dimension. However, the overall change is smaller than that of either of the blue or yellow emitters and the color remains substantially white. Referring to FIG. 5, a graph of a constant D65 white point 200 is shown at different, complementary yellow and blue emission frequencies. As can be seen from this graph, a greater change in the yellow wavelength is required to offset a smaller change in the blue wavelength to maintain the white point. Further, experiments conducted by the applicants have shown that observers are more tolerant of color shifts in white or neutrals towards the blue direction than towards the yellow direction. The emitters shown in FIG. 4 take advantage of these effects by balancing the blue-yellow contributions to minimize the yellow shift while permitting some deviation in the blue direction. This change can be physically controlled by employing a color filter formed over the complementary sub-pixel that preferentially transmits light emitted at a normal angle with respect to the substrate and preferentially absorbs light emitted at an angle other than the normal. For example, a filter (40Y in FIG. 1) may be employed over the yellow-light-emitting optical microcavity 66. The color filter absorbs greenish light having a wavelength less than, for example, 570 nm, 560 nm, or 550 nm. This will have the effect of limiting the movement of the white point or, equivalently, increasing the relative impact of the blue sub-pixel. In alternative embodiments and as modeled by the applicants, a filter (e.g. 40B in FIG. 1) that absorbs bluish light having a wavelength less than, for example, 500 nm, 490 nm, or 480 nm can be employed to limit white-point movement in the opposite direction.

A large variety of white-light-emitting materials can be employed in concert with the present invention, together with a wide selection of optical cavity sizes, both for the primary colored sub-pixels 50, 52, 54, and the complementary sub-pixel 56. In one embodiment of the present invention, the complementary sub-pixel 56 emits substantially yellow, orange, or red light at a normal angle with respect to the substrate and can include a color filter. In particular, the complementary sub-pixel is tuned to emit light having a peak wavelength longer than 550 nm at a normal angle and includes a color filter formed over the complementary sub-pixel; the color filter absorbing a substantial amount of the light having a wavelength shorter than 550 nm.

A variety of white-light emitters are be employed with the present invention and a variety of microcavities are be formed to create white light-emitting elements from these white-light emitters. In some embodiments of the present invention, the light-emitting layer 14 contains materials for emitting light having at least two emission peaks (e.g. a primary color and a color complementary to the primary color such as blue and yellow). These emission peaks can be located at frequencies that correspond to the desired colors of light emitted by the first and second sub-pixels to optimize emission efficiency. Likewise, the optical cavities can be tuned to the same frequencies as can the color filters, where present. In alternative embodiments of the present invention, the light-emitting layer 14 contains materials for emitting light having at least three emission peaks and the emission peaks can be located at frequencies that correspond to the colors of light emitted by the first, second and third subpixels or to the primary colors used by the device. In yet other alternative embodiments of the present invention, the light-emitting layer 14 contains materials for emitting light having at least four emission peaks and the emission peaks can be located at frequencies that correspond to the colors of light emitted by the first, second, third and fourth subpixels. In these various embodiments, it is generally the case that multi-peak, broad-band emission is perceived as substantially white light and the unpatterned, light-emitting layer is a white-light-emitting layer.

In these various embodiments, it is helpful if the second sub-pixel has a higher luminance efficiency than the first sub-pixel or the second sub-pixel has a higher luminance efficiency than at least one of the sub-pixels other than the second sub-pixel, thereby enabling the complementary sub-pixel to compensate for a relatively less efficient primary sub-pixel, for example the first sub-pixel.

In various specific embodiments, the light-emitting microcavity diode device of the present invention employs an optical cavity for the first sub-pixel that is tuned to emit blue light, an optical cavity for the second sub-pixel that is tuned to emit yellow light, an optical cavity for the third sub-pixel that is tuned to emit red light and the optical cavity of the fourth sub-pixel is tuned to emit green light. The third sub-pixel can employ a red color filter and the fourth sub-pixel can employ a green color filter. Either the blue or yellow sub-pixels can include a color filter, but preferably neither the blue nor yellow sub-pixels include a color filter. In this latter case, the blue emission from the microcavity should both meet the gamut requirements of the full-color LED device and effectively compensate for angular color changes in the yellow sub-pixel. While angular color changes are also found in the blue, applicants have determined that the shift of the blue sub-pixel to higher frequencies (i.e. bluer) is generally acceptable to viewers. Hence angular color compensation can be necessary for red, green, or yellow emitters but not necessarily for blue emitters.

In an alternative, specific embodiment of the present invention, the optical cavity of the first sub-pixel is tuned to emit green light, the optical cavity of the second sub-pixel is tuned to emit magenta light, the optical cavity of the third sub-pixel is tuned to emit red light and the color filter is a red color filter, and the optical cavity of the fourth sub-pixel is tuned to emit blue light. In another alternative, specific embodiment of the present invention, the optical cavity of the first sub-pixel is tuned to emit red light, the optical cavity of the second sub-pixel is tuned to emit cyan light, the optical cavity of the third sub-pixel is tuned to emit green light and the color filter is a green color filter, and the optical cavity of the fourth sub-pixel is tuned to emit blue light.

Figure 6A:
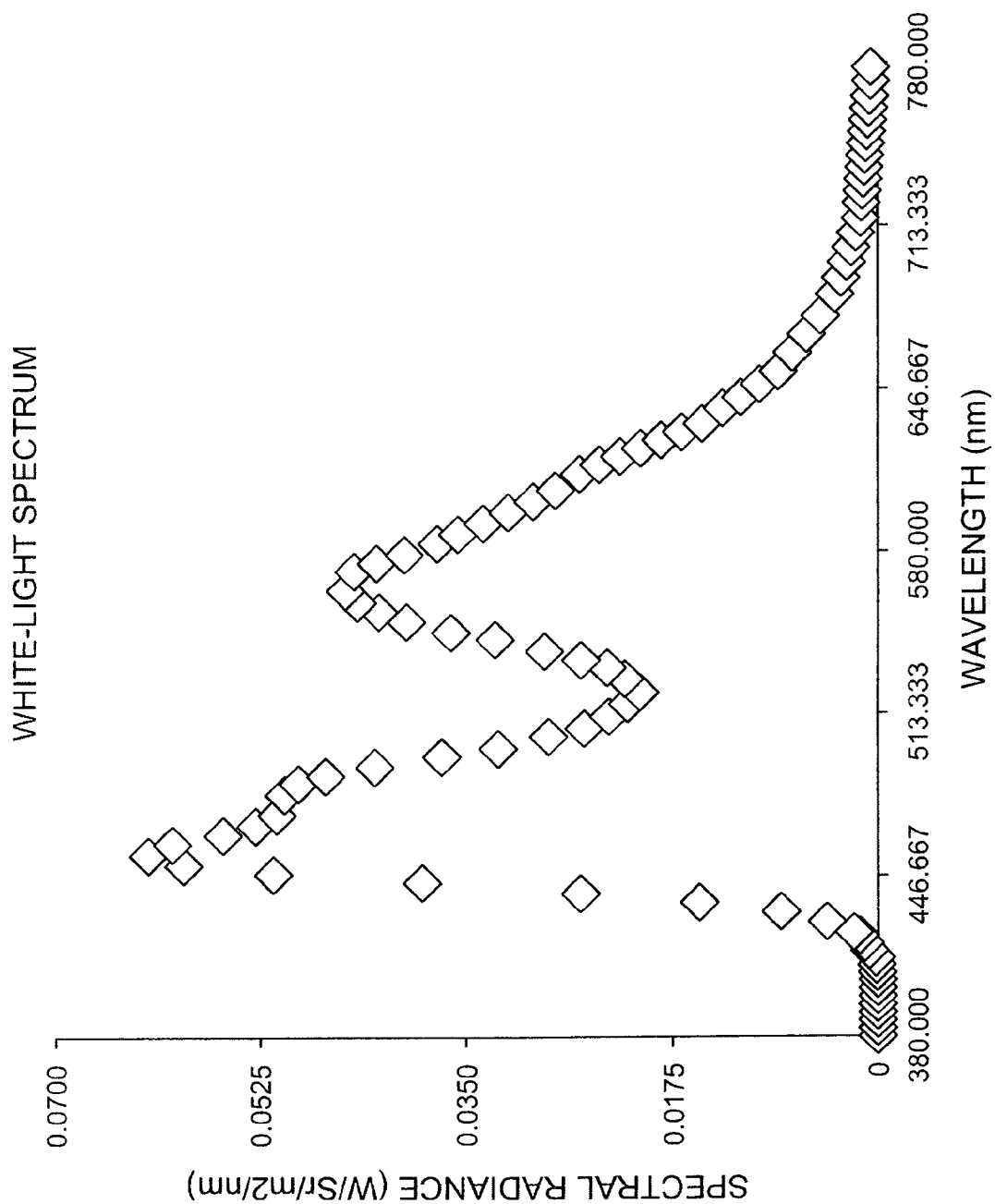
FIG. 6A is a graph illustrating the spectrum of a white emitter at a normal viewing angle without a microcavity structure useful in various embodiments of the present invention.
Figure 6B:
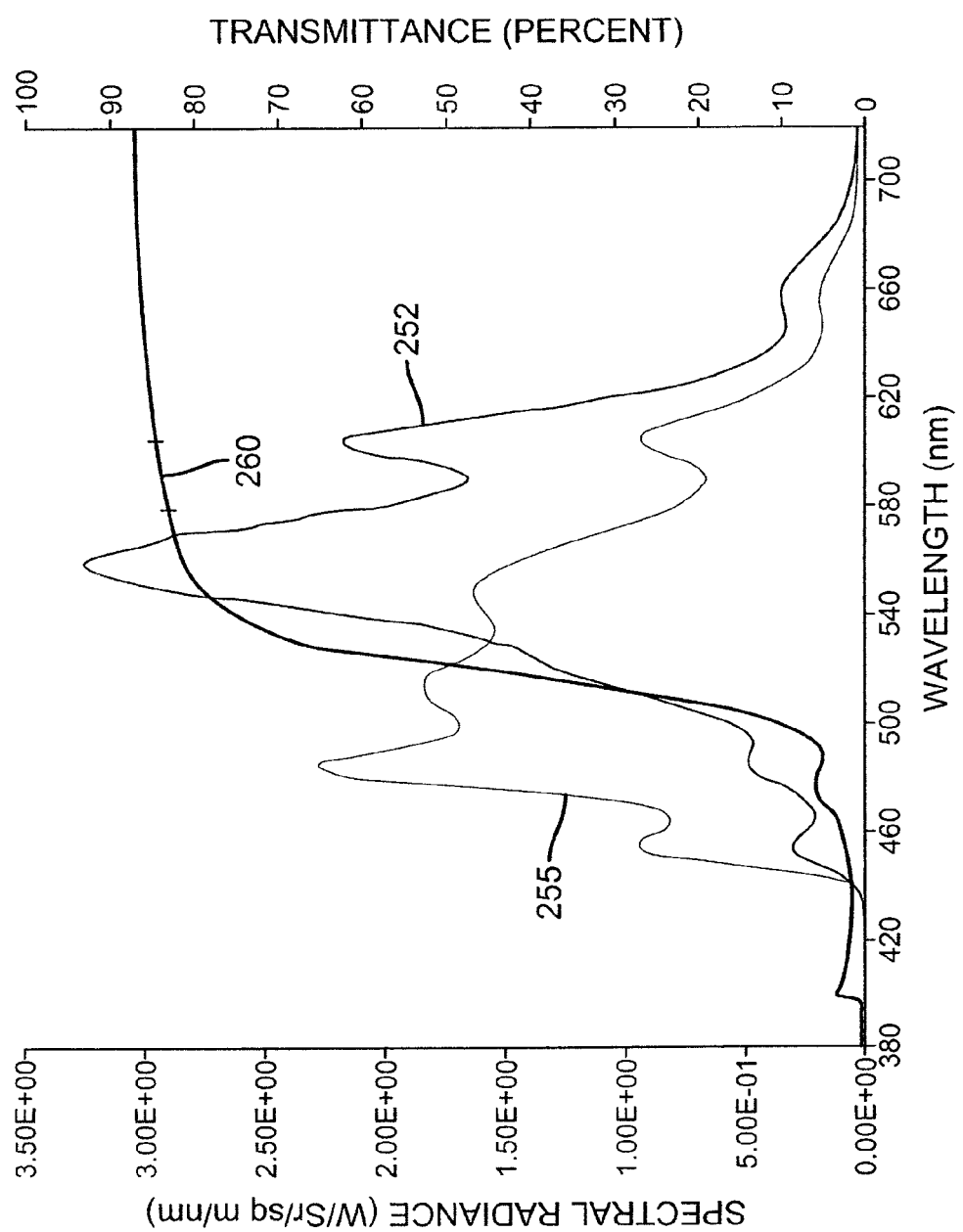
FIG. 6B is a graph illustrating the spectrum of a white emitter with a microcavity at a normal viewing angle and at a different viewing angle together with the spectrum of a color filter useful in various embodiments of the present invention.
Figure 6C:
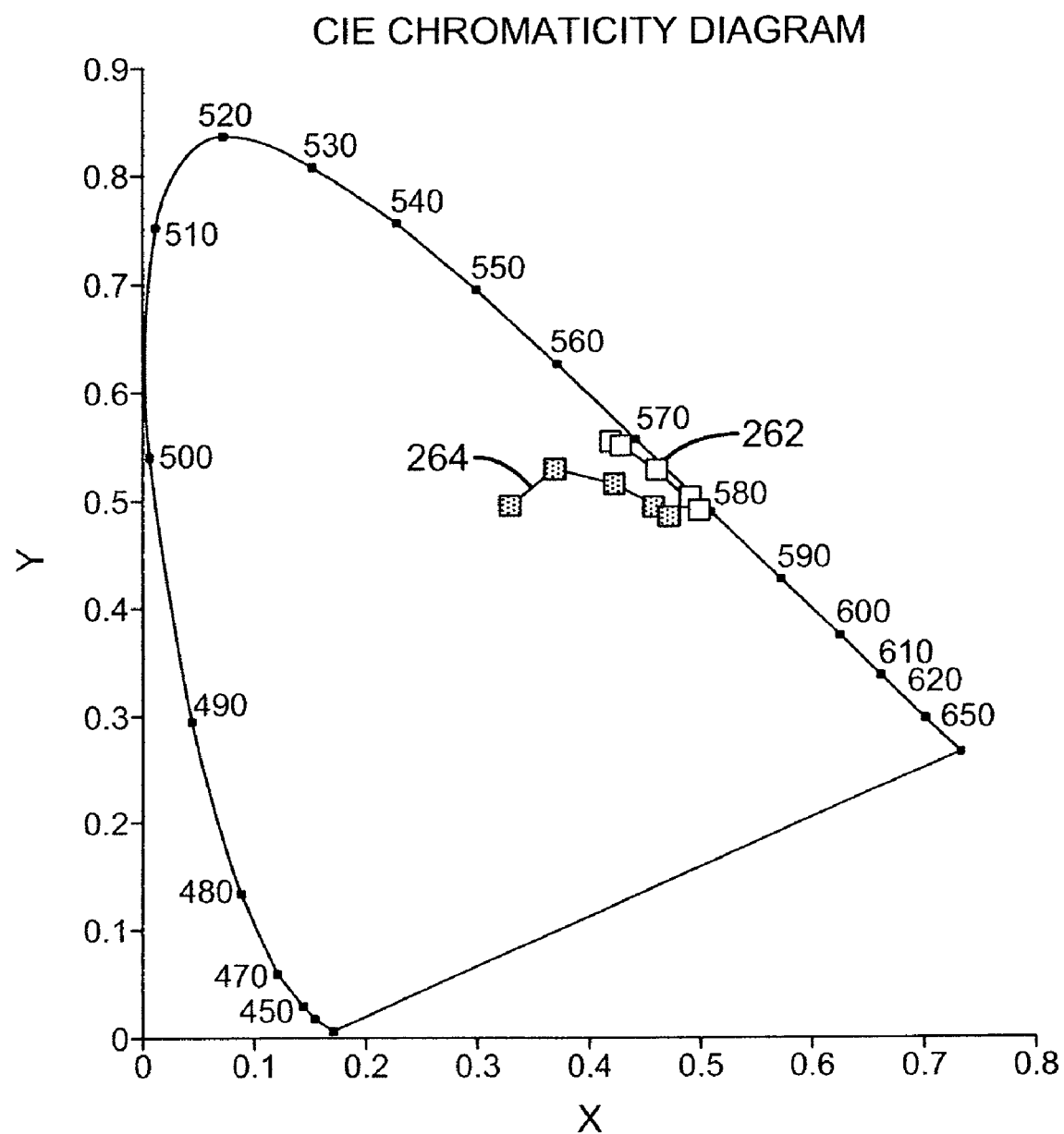
FIG. 6C is a graph illustrating the light emission wavelength wavelengths in CIE x and CIE y space of an embodiment of the present invention that incorporates a color filter.

Referring to FIG. 6A, a graph of the spectrum 250 of a white-light emitter, made by applicants, and useful for the present invention is illustrated. Referring to FIG. 6B, spectrum 252 is the light output from one microcavity useful as the yellow sub-pixel. As the viewing angle increases, the emission frequency increases, shown by a shifted spectrum 255. By employing a color filter (e.g. a yellow color filter) with a high-pass spectrum 260 formed over the complementary sub-pixel 56, light may be preferentially transmitted through the color filter at a normal angle, with respect to the substrate, and preferentially absorbed by the color filter at an angle other than the normal. Hence, the color shift with viewing angle may be reduced without reducing the amount of light emitted at a normal angle. Referring to FIG. 6C, the color shift with angle 264 for a white emitter in a microcavity tuned for yellow emission without a color filter, is longer than the color shift with angle 262 for a white emitter in a microcavity tuned for yellow emission with a color filter. The color filters (including those of the colored sub-pixels) will, however, reduce the luminance of the device at angles away from the normal. It should be noted, however, that the relative luminance efficiency as well as the chromaticity coordinate of the complementary sub-pixel will change as a function of viewing angle. In some such devices, using a yellow filter to reduce the luminance of the yellow sub-pixel as a function of viewing angle can be useful in maintaining a relatively constant luminance, because the luminance efficiency of the human eye increases as the peak in the yellow moves towards 550 nm.

Figure 7:
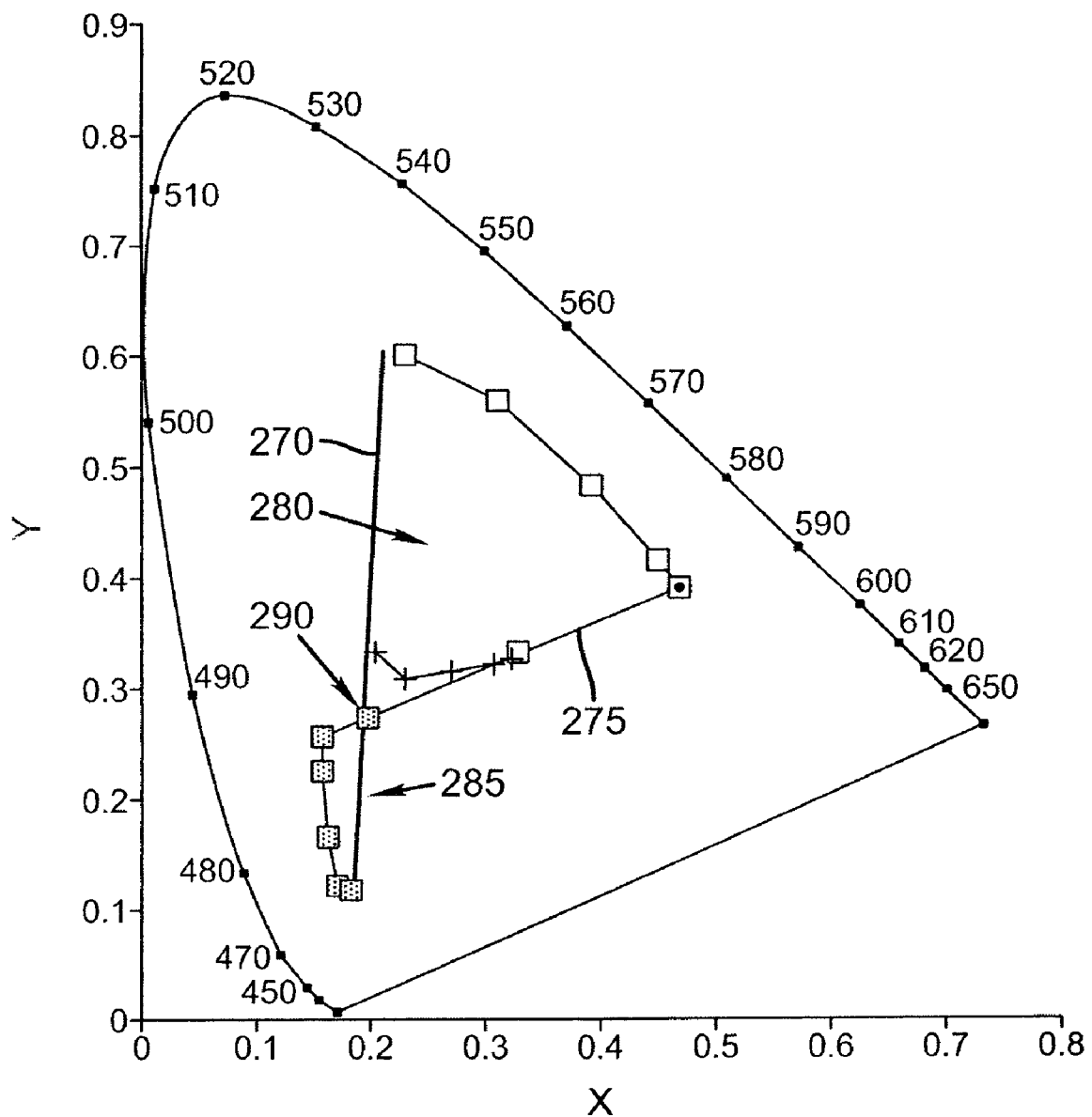
FIG. 7 is a graph illustrating in greater detail various portions of FIG. 4.
Figure 8:
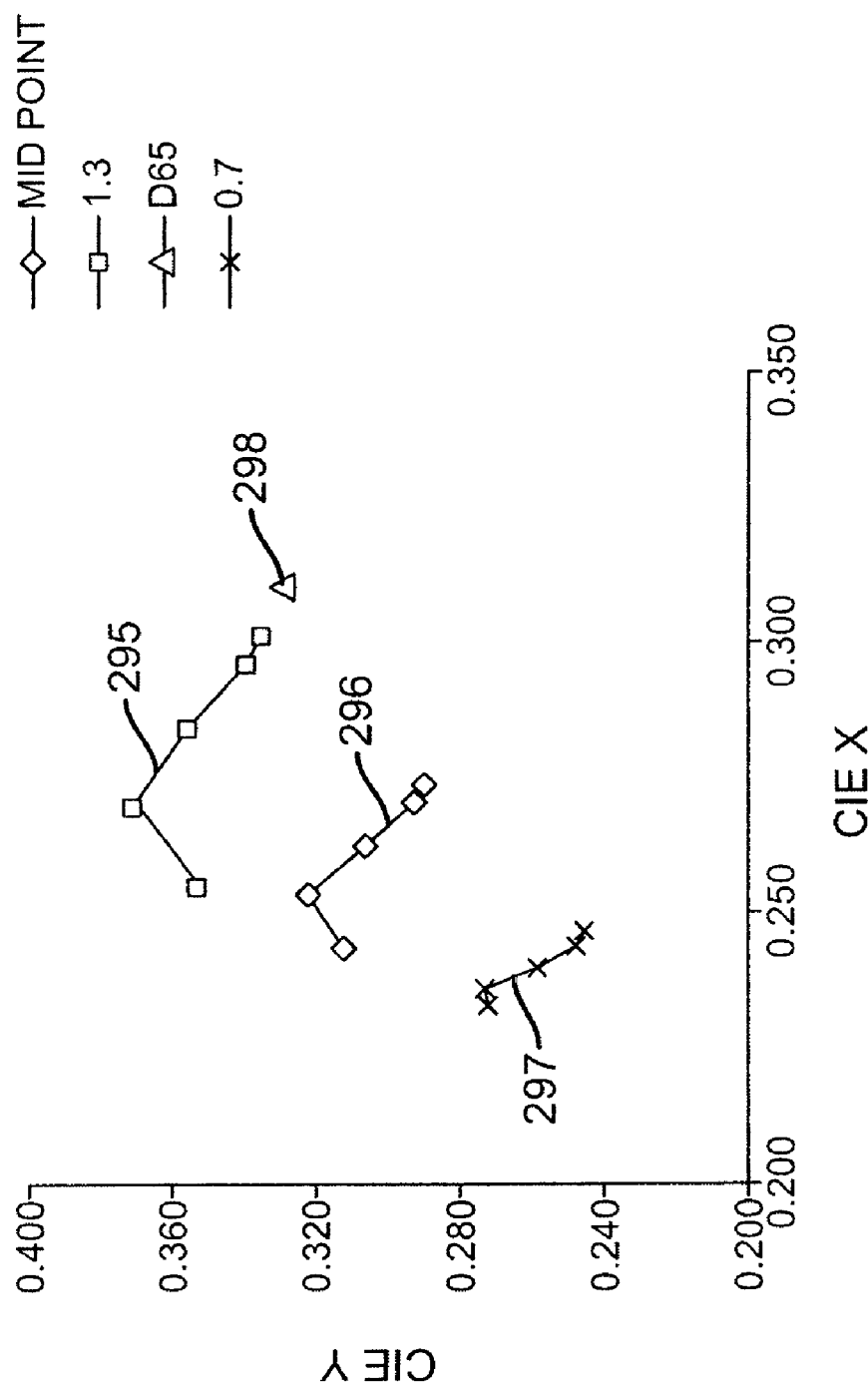
FIG. 8 is a graph illustrating the white point variation with viewing angle for a white sub-pixel with different relative sizes of the primary and complementary sub-pixels according to various embodiments of the present invention.
Figure 9:
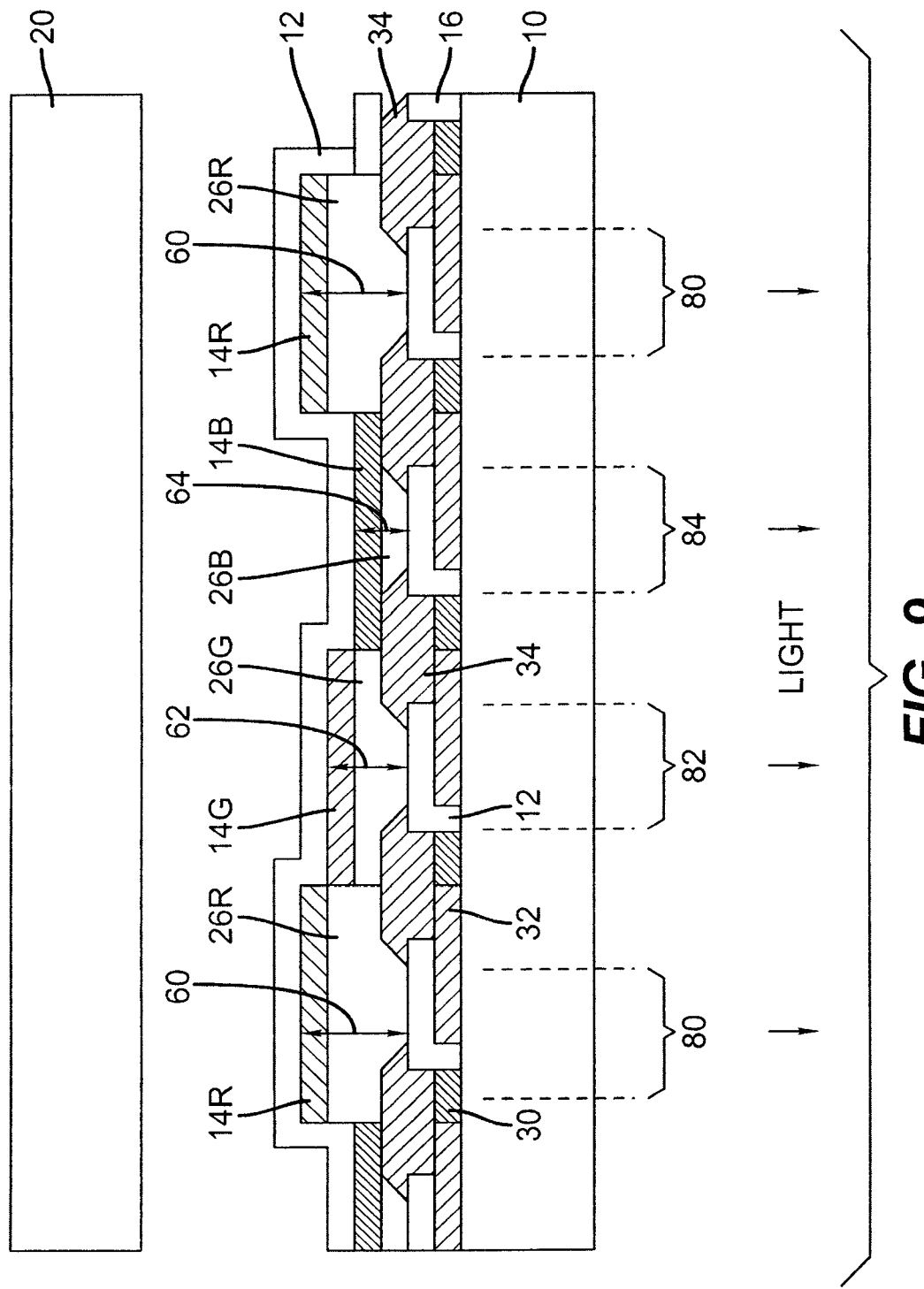
FIG. 9 illustrates a partial cross section of a prior-art bottom-emitter LED device.

The light emission from devices of the present invention may be further controlled by employing different luminance ratios for the first sub-pixel (e.g. 54) and the complementary second sub-pixel 56 to achieve different device white points. As shown in FIG. 7, boundary lines 270 and 275 connecting the CIE x and y coordinates of blue and yellow emitters at the minimum and maximum angles of interest form areas 280 and 285 with a common intersection point at point 290. By changing the luminance ratio of the sub-pixels 54, 56, the relative positions of the white points may be moved closer to, or farther from, the intersection point 290. Hence, the amount of change in white point can be reduced as the white points move closer to the intersection point 290. Likewise, the amount of white-point change can be increased as the white points move further from the intersection point 290. Since, in typical organic light-emitting diode systems (OLEDs), yellow emitters are more efficient than blue, it can be advantageous to move the emitters toward the yellow emission points, even if the white points vary more, as long as the white-point variation is acceptable. Referring to FIG. 8, three curves are shown in a CIE x and y graph representing the white point variation from minimum viewing angle to maximum viewing angle for a white-light emitter (a different white-light from that of FIG. 7). The relative luminance values of the yellow sub-pixel 56 vs. blue sub-pixels 54 are equal for curve 296) 1.3 for curve 295, and 0.7 for curve 297. A D65 white point is shown as point 298. The relative light emission and color shift shown in curve 295 is relatively greater than those of curves 296 or 297.

Matching the spectrum of the emissive material, the color filter peak transmissions, and the optical microcavity response may increase the light emission from the optical cavities of the present invention. That is, the optical cavities of the colored sub-pixels may be tuned to an approximate peak wavelength corresponding to the peak transmission wavelength of the corresponding color filter by changing the optical path length of the cavity. Likewise, the optical microcavities of the white sub-pixels may be tuned to one or more peak wavelengths approximately corresponding to the peak emission wavelengths of the white-light-emitting layer. Similarly, the peak emission wavelengths of the white-light-emitting layer may be matched to the peak transmission wavelength of the corresponding color filter.

It may also be possible to design a system in which the normal, combined emission of the first and second sub-pixels is at a specific white point, such as D65. However, it is possible that the color change with viewing angle or average emission from a desired white point of such a design may be greater than an alternative design in which the emission stays closer to a desired white point or has a reduced change in white point with changing viewing angle, but never actually emits light at the desired white point. Such a design, in which the average performance is superior, may be desired. By average emission is meant the average white point for all of the viewing angles of interest, either weighted or unweighted by importance in an application. Hence, a preferred design may tune the emissions of the white sub-pixel to minimize the difference between the average emission of the white sub-pixel and a preferred device white-point at more than one angle, rather than to match a desired white point at a single viewing angle. Often, it may then be possible to apply the red and green sub-pixels to adjust the white-point of the display (i.e., by adding the correct proportion of red and green light, the color of white emission may be moved towards the chromaticity of the yellow sub-pixel).

In embodiments of the present invention, the third and fourth sub-pixels are typically applied primarily when forming saturated colors while the first sub-pixel will be applied for forming saturated colors, as well as for forming all near-neutral colors. The second sub-pixel will generally be applied only when forming near-neutral colors. Therefore, it is the first sub-pixel that will receive the most use from among the sub-pixels. As a result this first sub-pixel is likely to undergo a larger degree of aging than the remaining sub-pixels if all of the sub-pixels have an equal area. Therefore, in a preferred embodiment, the first subpixel will have a larger emitting area than at least one of the other sub-pixels.

A variety of light-emissive materials can be employed in the present invention. For example, the white-light-emitting layer includes organic materials such as small-molecule organic or polymer materials or inorganic quantum dots formed in a poly-crystalline semiconductor matrix. Conventional photolithographic techniques are employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide, or organic materials. Organic materials are deposited by various means known in the art, for example, vacuum evaporation. However, such means preferably provide sufficient precision and accuracy to enable the consistent manufacturing of the optical cavities. In particular, the Kodak Vapor Injection System™ is a linear, organic vacuum evaporation source providing deposition of organic layers to within 1% uniformity and accuracy that can be usefully employed. Suitable semi-transparent cathodes are formed by evaporation or sputter techniques known in the art, for example of silver, magnesium, aluminum or other metals or metal alloys. These semi-transparent electrodes will typically have a reflectance of greater than 20% and will ideally have an absorbance of less than 10%. Encapsulation techniques for both organic and inorganic materials useful for the present invention are known in the art. The present invention can be employed with various elements, such as circular polarizers (18 in FIG. 1), suitable for improving device ambient contrast ratio. In one embodiment, the present invention is a top-emitter device, as shown in FIG. 1. In an alternative embodiment, (not shown) the device is a bottom-emitter device.

Figure 10:
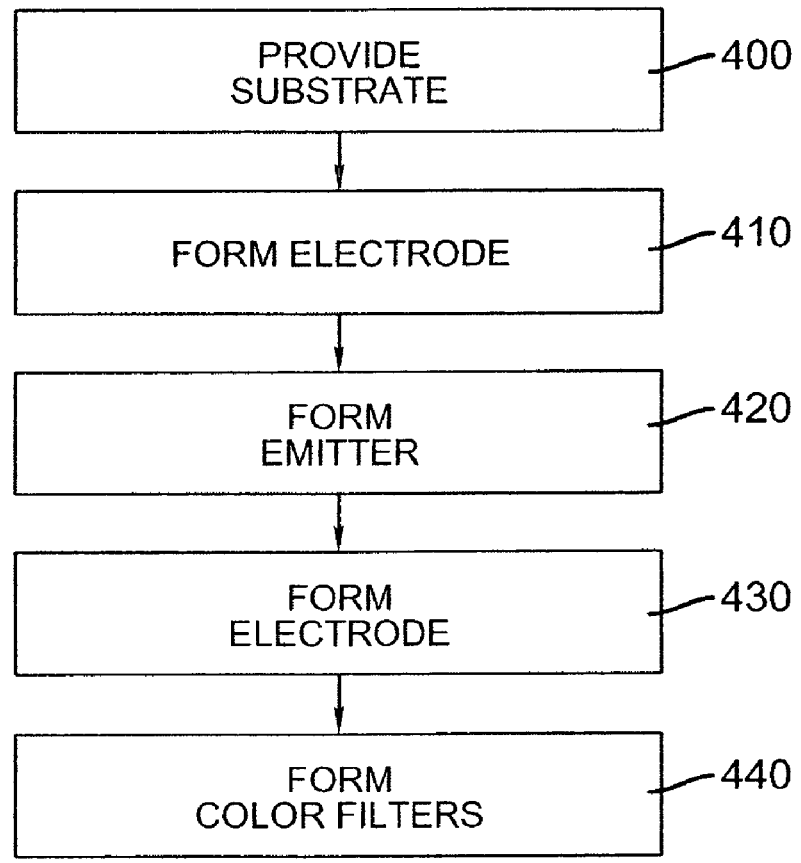
FIG. 10 is a flow diagram according to a method of the present invention.

Referring to FIG. 10, according to the present invention, a method of making an LED device includes the steps of: 400 providing a substrate; 410 forming a reflective electrode and 420 forming an unpatterned white-light-emitting layer over the reflective electrode. A semi-transparent electrode can be formed 430 over the reflective electrode so that the unpatterned white-light-emitting layer is formed between the reflective electrode and the semi-transparent electrode, the reflective electrode, semi-transparent electrode, and unpatterned white-light-emitting layer forming an optical cavity, and wherein either the reflective or semi-transparent electrode is patterned to form a plurality of independently-controllable light-emitting sub-pixel elements. Step 440 forms a color filters over a side of the semi-transparent electrodes, opposite the unpatterned white light-emitting-layer, in correspondence with some of the independently-controllable light-emitting elements to form colored sub-pixels. The color filters can be at least two different colors. At least one independently-controllable light-emitting element emits light complementary to light emitted from a colored sub-pixel to form a complementary sub-pixel. In an alternative embodiment of the present invention, the unpatterned white-light-emitting layer is formed over the semi-transparent electrode.

Through consumer research and optimization of white-light emitters, and with carefully selected optical cavity choices, applicants have demonstrated that the color change in white-light emitters using optical microcavities of the present invention is acceptable to consumers. Such microcavity structures have advantages, particularly in top emitter configurations, since a semi-transparent electrode (for example comprising a thin layer of silver) is much more electrically conductive than a fully transparent electrode (for example, comprising a transparent conductive oxide such as indium tin oxide). The present invention provides improved light output from the microcavity structure, reduced angular color shift, and reduced costs from employing an unpatterned light-emitting layer, either organic or inorganic.

Figure 11:
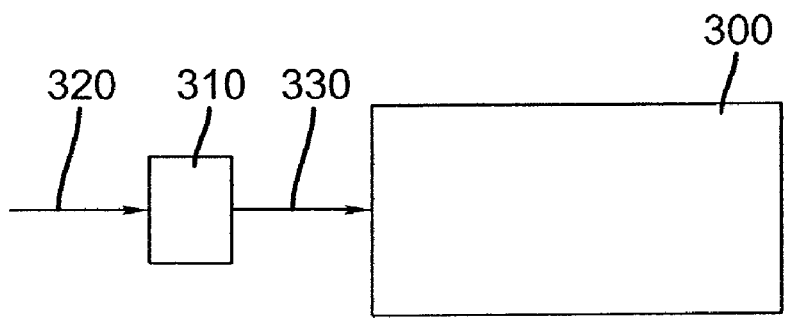
FIG. 11 is a system employing an LED device according to the present invention.

Referring to FIG. 11, the present invention can be employed in an information-display system having an LED display device 300 (shown in greater detail in FIG. 1) and a controller 310 for receiving information signals 320 (e.g. text, and images), processing the signals to form a converted signal suitable for the display device 300, and driving the display 300 to display the converted signal 330.

Figure 12:
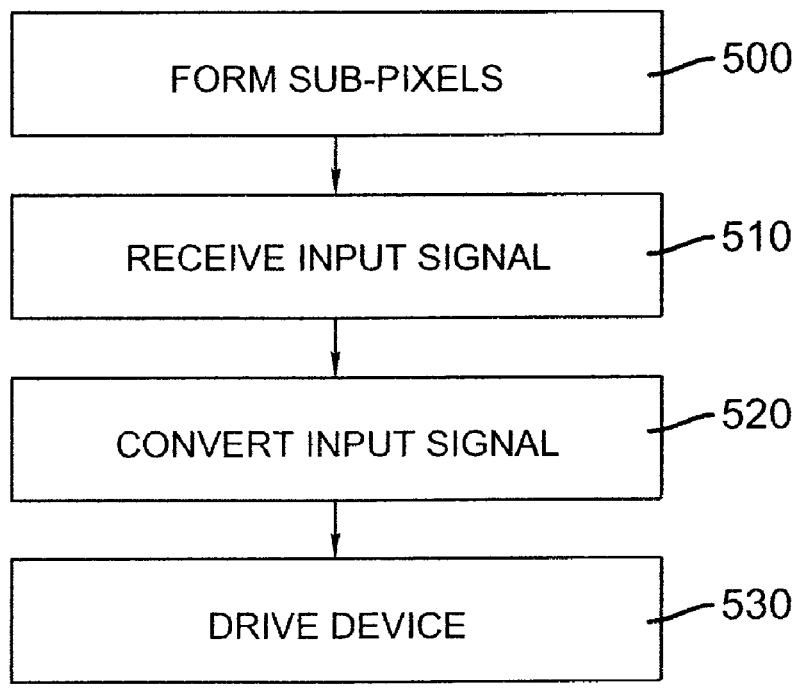
FIG. 12 is a flow diagram according to another method of the present invention.

Referring to FIG. 12, a method for controlling a light-emitting microcavity diode device includes the steps of forming 500 at least four independently-controllable sub-pixels, each sub-pixel formed within a microcavity, three of the sub-pixels emitting light of a primary color and at least one of the three sub-pixels having a color filter, and the fourth sub-pixel emitting light of a color complementary to one of the primary colors without a color filter, step 510 receives an RGB input signal, and step 520 converts the input signal to a converted signal of at least four components. The four components include red, green, blue, and a color complementary to one of the red, green, or blue colors. The conversion 520 step can include calculating the neutral component of the input signal and preferentially applying the complementary color and the corresponding primary color to form the neutral component of the input signal. Conversion step 520 can also include preferentially applying the three primary colors when forming colors that are near the boundary defined by the chromaticity coordinates of the three primary colors. This preferential application can reduce the impact of angular color change on saturated colors similar to the complementary color. In one embodiment of the present invention, the fourth sub-pixel emits yellow light and the complementary component is yellow. A preferential application of red and green to form yellow (the red and green sub-pixels having color filters to reduce angular color change) rather than the yellow (the yellow, complementary sub-pixel not having a color filter) reduces the angular color change of the yellow emission. The converted signal may then be employed in step 530 to drive a device.

Figure 13:
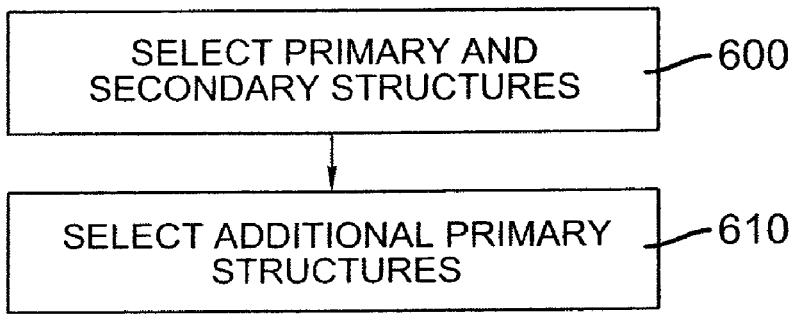
FIG. 13 is a flow diagram according to yet another method of the present invention.

Referring to FIG. 13, a light-emitting microcavity diode device can be formed by selecting primary and secondary (complementary) colored, light-emitting microcavity structures in step 600 that when applied together provide a display white point having an acceptable change in chromaticity coordinates as a function of viewing angle. An array comprising first primary colored microcavity structure and second complementary colored, light-emitting microcavity structure, together with at least one additional primary-colored, light-emitting microcavity structure can be formed in step 610 on a substrate. At least one additional primary colored, light-emitting microcavity structure includes a color filter and at least one of the first primary colored microcavity structures and the complementary colored, light-emitting microcavity structures does not include a color filter.

In a patterned device, different materials are employed to emit light of different colors in response to a current. In contrast, in an unpatterned device, the same materials are employed to emit a single color, for example, white, and the light emitted by the color sub-pixels is colored by employing color filters and optical cavities in combination with the white-light emitter. Often, a white-light emitter will include a combination of materials in one or more unpatterned layers that each emit a different color, for example, blue and yellow or red and cyan, to emit a light that is perceived, overall, to be white. One important point is that however many light-emitting materials are included in a single layer, or however many layers are included, the layers are unpatterned and their aggregate emission employed in all of the sub-pixels in all of the pixels. All of these layer combinations are included in the present invention and are considered a part of the light-emitting layer 14.

It is known in the prior art that, in LED devices, light is trapped by total internal reflection in the high-optical-index layers that actually emit light, or high-optical index charge-control layers, or high-optical index transparent electrodes. Light emitted at low angles to the normal is emitted from the device, while light emitted at a relatively higher angle to the normal can be trapped in the high-optical-index layers. By employing an optical cavity structure, the emission of light at high angles is reduced so that more light is emitted from the device at relatively lower angles to the normal.

It is also true that the color of light emitted from optical cavity structures has a dependence on the viewing angle. This angular dependence can be extremely irritating to viewers, in particular for applications in which a large viewing angle is valued. This color shift with angle is especially noticeable for color sub-pixels using a white-light emitter. However, the color filters employed in the present invention for the color sub-pixels not only absorb ambient light, they also reduce the observed dependence on angle of the light color found with an optical cavity device. Such color filters, however, reduce device efficiency.

The color shift reduction found with increasing angle for the color sub-pixels provided by the present invention does reduce the luminance of these color sub-pixels. Such a reduction in luminance is less noticeable and objectionable to viewers than a shift in color. Moreover, to the extent that the color sub-pixels decrease in luminance, while the luminance of the complementary sub-pixel is comparatively smaller (although a white-point shift may occur) as a result of changing viewing angle, the net effect may be a reduction in overall color saturation. Such a color saturation reduction may be negligible for some images (i.e. those images with little saturated color) and less noticeable than a change in color for those images with strongly saturated colors. Hence, improved image quality is obtained. Moreover, since most images are relatively unsaturated, the net luminance effect may often be relatively minor.

Applicants have physically constructed numerous OLED devices employing microcavities, both with patterned, colored emitters and with white emitters and have studied their performance together with the performance of circular polarizers and color filters. Moreover, optical modeling tools have been employed to understand the performance of the present invention under a variety of circumstances. In general, a white-light-emitting, unpatterned OLED device employing an optical cavity and color filters can be expected to roughly double the light output of the colored pixels in comparison to a white-light-emitting, unpatterned OLED device without an optical cavity and color filters. However, since the sub-pixels that do not employ a color filter are more efficient and the complementary sub-pixel is also more efficient than at least one of the primaries (and more often two or all of the primaries), the use of a complementary sub-pixel improves the overall performance of an OLED device as most images have few saturated colors and the more-efficient complementary light emitter is used disproportionately.

Further details with regard to the use of circular polarizers and color filters are disclosed in commonly-assigned, co-pending U.S. application Ser. Nos. 11/842,221 and 11/842,229 and are hereby incorporated by reference in their entirety.

LED devices of this invention can employ various well-known optical effects in order to enhance their properties, if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it should be understood that variations and modifications can be effected within the spirit and scope of the invention.

PARTS LIST 10 substrate
11 reflective layer
12 reflective electrode
13, 3R, 13G, 13B, 13Y spacer
14 light-emitting layer(s)
14R, 14G, 14B patterned light-emitting layers
15 transparent conductive layer
16 semi-transparent electrode
18 circular polarizer
20 cover
26 spacers
26R, 26G, 26B, 26Y spacer
30 thin-film circuitry
32 insulator
34 insulator
40R, 40G, 40B, 40Y color filter
40K black matrix
50, 52, 54, 56 light-emitting elements, sub-pixels
60, 62, 64, 66 optical cavity
80, 82, 84 light
200 D65 white point
205 spectrum locus
206 purple boundary
210 CIE coordinates of blue emission curve
215 CIE coordinates of yellow emission curve
220 white point curve
225 white point at normal viewing angle
230 white point at maximum viewing angle
250 white emission spectrum
252 white microcavity emission spectrum
255 shifted white microcavity emission spectrum
260 color filter transmission spectrum
262 color shift with angle
264 color shift with angle
270 boundary line
275 boundary line
280 region
285 region
290 intersection
295 emission curve
296 emission curve 297 emission curve
298 D65 white point
300 device
310 controller
320 signal
330 converted signal
400 process step: provide substrate
410 process step: form electrode
420 process step: form unpatterned white-light-emitting layer
430 process step: form semi-transparent electrode
440 process step: form color filters
500 process step: form sub-pixels
510 process step: receive input signal
520 process step: convert input signal
530 process step: drive device with converted signal
600 process step: select primary and secondary microcavity structures
610 process step: form additional light-emitting microcavity structure

The invention claimed is:

1. A light-emitting microcavity diode device, comprising:
  a) a reflective electrode and a semi-transparent electrode formed over a substrate with an unpatterned light-emitting layer formed between the reflective electrode and the semi-transparent electrode, the reflective electrode, semi-transparent electrode, and unpatterned light-emitting layer forming an optical cavity, and wherein either the reflective or semi-transparent electrode is patterned to form a plurality of independently-controllable, light-emitting sub-pixels, and wherein at least one, and fewer than all, of the sub-pixels emits light through a color filter;
  b) a first sub-pixel emits light having a first primary color and a second sub-pixel emits a light of a complementary color with respect to the first primary color, the light from the first and second sub-pixels changing at one or more different angles and wherein the color of the combined light of the first and second sub-pixels changes less at the one or more different angles than the light from at least one of the first or second sub-pixels;
  c) a third sub-pixel emitting light of a second primary color different from the first primary color and wherein the third sub-pixel emits light through a color filter;
  d) a fourth sub-pixel emitting light of a third primary color different from the first and second primary colors;
  e) wherein the second sub-pixel has a higher luminous efficiency than either of the third or fourth sub-pixels; and
  f) a controller for receiving information signals, processing the signals to form a converted signal suitable for the display device and driving the display device to display the converted signal, wherein the controller calculates the neutral component of the information signals and applies the first and second subpixels to form the neutral component of the information signal.

2. The light-emitting microcavity diode device of claim 1 wherein the first sub-pixel or second sub-pixel does not include a color filter.

3. The light-emitting microcavity diode device of claim 1 wherein the second sub-pixel emits light having a peak wavelength longer than 550 nm at a normal angle and includes a color filter for absorbing light having a wavelength shorter than 550 nm.

4. The light-emitting microcavity diode device of claim 1, wherein the light-emitting layer contains materials for emitting light having at least two emission peaks and wherein these emission peaks are located at frequencies that correspond to the colors of light emitted by the first and second sub-pixels.

5. The light-emitting microcavity diode device of claim 1, wherein the light-emitting layer contains materials for emitting light having at least three emission peaks and wherein these emission peaks are located at frequencies that correspond to the colors of light emitted by the first, second and third subpixels.

6. The light-emitting microcavity diode device of claim 1 wherein the second sub-pixel has a higher luminance efficiency than the first sub-pixel.

7. The light-emitting microcavity diode device of claim 1 wherein the second sub-pixel has a higher luminance efficiency than at least one of the sub-pixels other than the second sub-pixel.

8. The light-emitting microcavity diode device of claim 1 wherein the light-emitting layer emits white light.

9. The light-emitting microcavity diode device of claim 1 wherein the fourth sub-pixel emits light through a color filter.

10. The light-emitting microcavity diode device of claim 1 wherein the optical cavity of the first sub-pixel is tuned to emit blue light, the optical cavity of the second sub-pixel is tuned to emit yellow light, the optical cavity of the third sub-pixel is tuned to emit red light and the color filter is a red color filter, and the optical cavity of the fourth sub-pixel is tuned to emit green light.

11. The light-emitting microcavity diode device of claim 10 wherein neither the blue nor yellow sub-pixels includes a color filter.

12. The light-emitting microcavity diode device of claim 1 wherein the optical cavity of the first sub-pixel is tuned to emit green light, the optical cavity of the second sub-pixel is tuned to emit magenta light, the optical cavity of the third sub-pixel is tuned to emit red light and the color filter is a red color filter, and the optical cavity of the fourth sub-pixel is tuned to emit blue light.

13. The light-emitting microcavity diode device of claim 1 wherein the optical cavity of the first sub-pixel is tuned to emit red light, the optical cavity of the second sub-pixel is tuned to emit cyan light, the optical cavity of the third sub-pixel is tuned to emit green light and the color filter is a green color filter, and the optical cavity of the fourth sub-pixel is tuned to emit blue light.

14. A display system comprising a light-emitting microcavity diode device as claimed in claim 1 and further comprising a controller for converting an RGB input signal into a converted signal for driving the light-emitting microcavity diode device and wherein the light-emitting microcavity diode device uses less power to display the converted signal than to display the input signal.

15. The light-emitting microcavity diode device of claim 1 wherein the controller applies the third and fourth subpixels to form the complementary-color component of the information signal.

16. A method of forming a light-emitting microcavity diode device, comprising the steps of:
  a) selecting primary and secondary colored, light-emitting microcavity structures that when applied together provide a display white point having an acceptable change in chromaticity coordinates as a function of viewing angle;
  b) forming an array comprising first primary colored microcavity structure and second complementary colored, light-emitting microcavity structure, together with two more primary colored, light-emitting microcavity structure on a substrate, wherein at least the one of the two more primary colored, light-emitting microcavity structures includes a color filter and at least one of the first primary colored microcavity structure and the complementary colored, light-emitting microcavity structure do not include a color filter; and c) providing a controller for receiving information signals, processing the signals to form a converted signal suitable for the display device and driving the display device to display the converted signal, wherein the controller calculates the neutral component of the information signals and applies the first and second subpixels to form the neutral component of the information signal.

* * * * *